US010886365B2

(12) United States Patent
Araoka et al.

(10) Patent No.: US 10,886,365 B2
(45) Date of Patent: Jan. 5, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventors: Tsuyoshi Araoka, Tsukuba (JP); Yusuke Kobayashi, Tsukuba (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 64 days.

(21) Appl. No.: 15/658,514

(22) Filed: Jul. 25, 2017

(65) Prior Publication Data

US 2018/0040687 A1 Feb. 8, 2018

(30) Foreign Application Priority Data

Aug. 5, 2016 (JP) .................................. 2016-155096

(51) Int. Cl.
*H01L 29/06* (2006.01)
*H01L 29/08* (2006.01)
*H01L 29/10* (2006.01)
*H01L 29/66* (2006.01)
(Continued)

(52) U.S. Cl.
CPC ........ *H01L 29/063* (2013.01); *H01L 29/0878* (2013.01); *H01L 29/1095* (2013.01); *H01L 29/1608* (2013.01); *H01L 29/66068* (2013.01); *H01L 29/7813* (2013.01); *H01L 29/0623* (2013.01)

(58) Field of Classification Search
CPC ...................................................... H01L 29/063
See application file for complete search history.

(56) References Cited

U.S. PATENT DOCUMENTS 5,910,669 A * 6/1999 Chang ................. H01L 29/0878
257/339
2009/0146209 A1 6/2009 Akiyama et al.
(Continued)

FOREIGN PATENT DOCUMENTS

JP 2009141243 A 6/2009
JP 2009-260253 A 11/2009
(Continued)

*Primary Examiner* — Omar F Mojaddedi
(74) *Attorney, Agent, or Firm* — Rabin & Berdo, P.C.

(57) ABSTRACT

A silicon carbide semiconductor device has an n-type drift layer provided on a front surface of an n$^+$-type silicon carbide substrate. In a surface layer of the n-type drift layer, a first p$^+$-type region is provided. On a front surface side of the n$^+$-type silicon carbide substrate, a trench is formed. The first p$^+$-type region includes a deep first p$^+$-type region and a shallow first p$^+$-type region, the deep first p$^+$-type region being at a position farther toward a drain electrode than a bottom of the trench is and the shallow first p$^+$-type region being at a position closer to a source region than the bottom of the trench is. An impurity concentration of the shallow first p$^+$-type region is lower than an impurity concentration of the deep first p$^+$-type region.

14 Claims, 7 Drawing Sheets

(51) Int. Cl.
*H01L 29/78* (2006.01)
*H01L 29/16* (2006.01)

(56) References Cited

U.S. PATENT DOCUMENTS

| | | | |
|---|---|---|---|
| 2011/0024831 A1* | 2/2011 | Nakano | H01L 29/0623 257/330 |
| 2012/0217513 A1* | 8/2012 | Tega | H01L 29/45 257/77 |
| 2013/0126904 A1* | 5/2013 | Masuda | H01L 21/3065 257/77 |
| 2015/0263130 A1* | 9/2015 | Aoi | H01L 29/0847 438/138 |
| 2016/0247910 A1* | 8/2016 | Suzuki | H01L 29/0623 |
| 2017/0133466 A1 | 5/2017 | Shiomi | |
| 2017/0141186 A1* | 5/2017 | Shiomi | H01L 29/7813 |
| 2017/0263757 A1* | 9/2017 | Saikaku | H01L 29/0878 |

FOREIGN PATENT DOCUMENTS

| | | | |
|---|---|---|---|
| JP | 2015072999 A | 4/2015 | |
| WO | 2016002769 A1 | 1/2016 | |
| WO | 2016042738 A1 | 3/2016 | |

\* cited by examiner

FIG.1
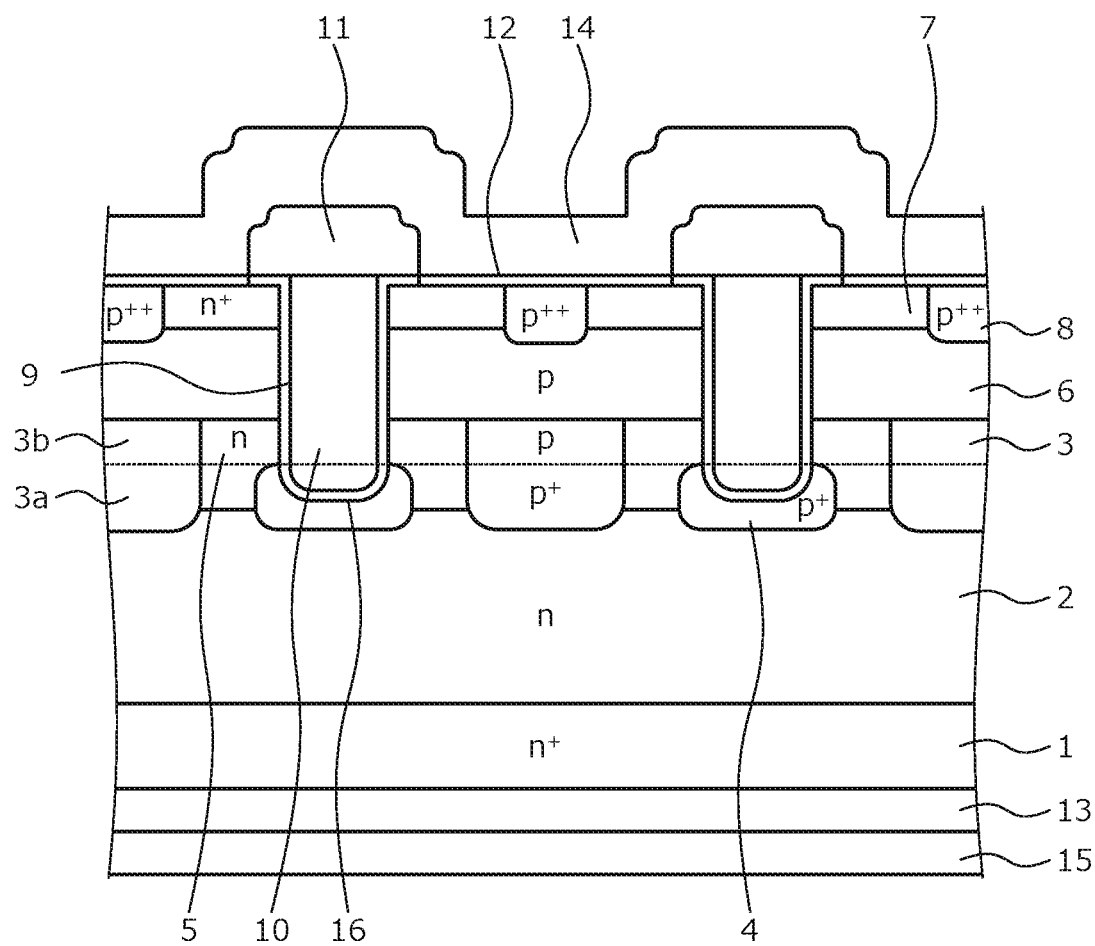
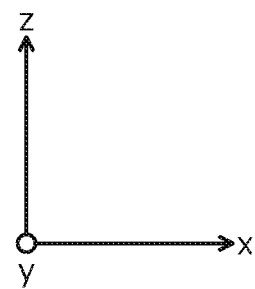

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-155096, filed on Aug. 5, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, vertical metal oxide semiconductor field effect transistors (MOSFETs) having a trench structure are produced (manufactured) to reduce element ON resistance in power semiconductor elements. In vertical MOSFETs, the cell density per unit area may be increased to a greater extent with a trench structure in which a channel is formed vertically with respect to the substrate surface as compared to a planar structure in which a channel is formed parallel to the substrate surface. As a result, the current density per unit are may be increased, which is advantageous in terms of cost.

However, when a trench structure is formed in a vertical MOSFET, to form a channel in a vertical direction, a structure is adopted in which a gate insulating film covers inner trench walls entirely. A portion of the gate insulating film at a bottom of the trench is near a drain electrode whereby a high electric field is likely to be applied to the portion of gate insulating film at the bottom of the trench. In particular, with wide bandgap semiconductors (semiconductors having a bandgap wider than that of silicon, for example, silicon carbide (SiC)), since ultra high voltage elements are produced, the gate insulating film at the bottom of the trench is adversely affected, causing reliability to decrease.

As a method to resolve such problems, a technique has been proposed in which a $p^+$-type region is provided between and parallel to trenches in a vertical MOSFET having a trench structure (for example, refer to Japanese Laid-Open Patent Publication No. 2009-260253).

SUMMARY OF THE INVENTION

According to one aspect of the present invention a semiconductor device includes a wide bandgap semiconductor substrate of a first conductivity type including a semiconductor having a bandgap wider than that of silicon; a first-conductivity-type wide bandgap semiconductor layer provided on a front surface of the wide bandgap semiconductor substrate and including a semiconductor having a bandgap wider than that of silicon, the first-conductivity-type wide bandgap semiconductor layer having an impurity concentration that is lower than that of the wide bandgap semiconductor substrate; a first base region of a second conductivity type selectively provided in a surface layer of the first-conductivity-type wide bandgap semiconductor layer having a first side and a second side, the surface layer being on the first side opposite the second side that faces the wide bandgap semiconductor substrate; a second base region of the second conductivity type selectively provided in the first-conductivity-type wide bandgap semiconductor layer; a second-conductivity-type wide bandgap semiconductor layer provided on the surface on the first side of the first-conductivity-type wide bandgap semiconductor layer, the second-conductivity-type wide bandgap semiconductor layer including a semiconductor having a bandgap wider than silicon; a source region of the first conductivity type selectively provided in the second-conductivity-type wide bandgap semiconductor layer; a trench penetrating the source region and the second-conductivity-type wide bandgap semiconductor layer, and reaching the first-conductivity-type wide bandgap semiconductor layer; a gate electrode provided in the trench on a gate insulating film; a source electrode in contact with the second-conductivity-type wide bandgap semiconductor layer and the source region; and a drain electrode provided on a rear surface of the wide bandgap semiconductor substrate. The first base region has a deep first base region and a shallow first base region, the deep first base region being at a position farther toward the drain electrode than a bottom of the trench is and the shallow first base region being at a position closer to the source region than the bottom of the trench is. An impurity concentration of the shallow first base region is lower than an impurity concentration of the deep first base region.

In the semiconductor device, the impurity concentration of the shallow first base region is at least an impurity concentration of the second-conductivity-type wide bandgap semiconductor layer.

In the semiconductor device, the impurity concentration of the shallow first base region is $2\times10^{17}/cm^3$ to $4.5\times10^{18}/cm^3$.

In the semiconductor device, a width of the shallow first base region is wider than a width of the deep first base region.

According to another aspect of the invention, a method of manufacturing a semiconductor device includes forming a first-conductivity-type wide bandgap semiconductor layer on a front surface of a wide bandgap semiconductor substrate of a first conductivity type and including a semiconductor having a bandgap wider than that of silicon, the first-conductivity-type wide bandgap semiconductor layer including a semiconductor having a bandgap wider than that of silicon and having an impurity concentration lower than that of the wide bandgap semiconductor substrate; selectively forming a first base region of a second conductivity type in a surface layer of the first-conductivity-type wide bandgap semiconductor layer; selectively forming a second base region of the second conductivity type in the first-conductivity-type wide bandgap semiconductor layer; forming a second-conductivity-type wide bandgap semiconductor layer on a surface of the first-conductivity-type wide bandgap semiconductor layer, the second-conductivity-type wide bandgap semiconductor layer including a semiconductor having a bandgap wider than silicon; selectively forming a source region of the first conductivity type in the second-conductivity-type wide bandgap semiconductor layer; forming a trench penetrating the source region and the second-conductivity-type wide bandgap semiconductor layer, and reaching the first-conductivity-type wide bandgap semiconductor layer; forming a gate electrode in the trench on a gate insulating film; forming a source electrode in contact with the second-conductivity-type wide bandgap semiconductor layer and the source region; and forming a drain electrode on a rear surface of the wide bandgap semiconductor substrate.

The first base region is formed to have a deep first base region and a shallow first base region, the deep first base region being at a position farther toward the drain electrode than a bottom of the trench is and the shallow first base region being at a position closer to the source region than the bottom of the trench is. The first base region is formed so that an impurity concentration of the shallow first base region is lower than an impurity concentration of the deep first base region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a cross-sectional view of a structure of a silicon carbide semiconductor device according to an embodiment;

DETAILED DESCRIPTION OF THE INVENTION

Figure 2:
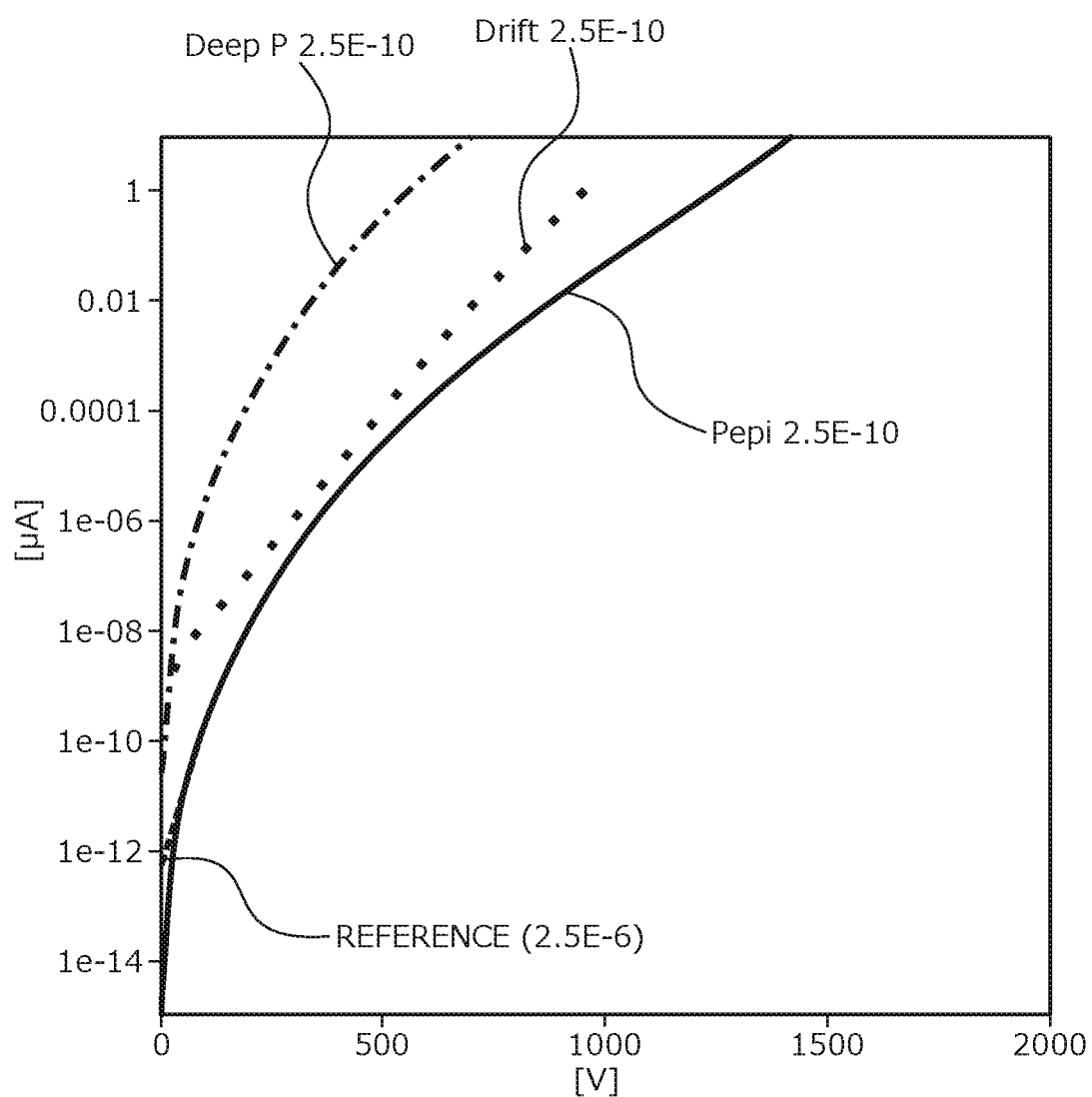
FIG. 2 is a graph of resistance and leak current with respect to drain voltage in regions of the silicon carbide semiconductor device according to the embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

FIG. 1 is a cross-sectional view of a structure of the silicon carbide semiconductor device according to an embodiment. However, the present invention is not limited to silicon carbide, and may be implemented using any wide bandgap semiconductor material, such as silicon dioxide, aluminium nitride, gallium nitride, boron nitride, and diamond. As depicted in FIG. 1, in the silicon carbide semiconductor device according to the embodiment, the n-type drift layer (first wide bandgap semiconductor layer of a first conductivity type) 2 is deposited on a first main surface (front surface), for example, (0001) face (Si face), of the $n^+$-type silicon carbide substrate (wide bandgap semiconductor substrate of the first conductivity type) 1.

The $n^+$-type silicon carbide substrate 1 is a silicon carbide single crystal substrate. The n-type drift layer 2 has an impurity concentration lower than that of the $n^+$-type silicon carbide substrate 1 and is, for example, a low-concentration n-type drift layer. The n-type epitaxial layer 5 is provided on a surface of the n-type drift layer 2 having a first side and a second side, the surface being on a first side opposite the second side that faces the $n^+$-type silicon carbide substrate 1. The n-type epitaxial layer 5 is a high-concentration n-type drift layer having an impurity concentration that is lower than that of the $n^+$-type silicon carbide substrate 1 and higher than that of the n-type drift layer 2.

The p-type base layer (second-conductivity-type wide bandgap semiconductor layer) 6 is provided on the first side of the n-type drift layer 2. The p-type base layer 6 is in contact with the first $p^+$-type region 3 described later. Hereinafter, the $n^+$-type silicon carbide substrate 1, the n-type drift layer 2, and the p-type base layer 6 are collectively regarded as a silicon carbide semiconductor base.

An $n^+$-type source region 7 and a $p''$-type contact region 8 are further provided.

The rear electrode (drain electrode) 13 is provided on a second main surface (rear surface, i.e., a rear surface of the silicon carbide semiconductor base) of the $n^+$-type silicon carbide substrate 1. The rear electrode 13 constitutes a drain electrode. On a surface of the rear electrode 13, the drain electrode pad 15 is provided.

On the first main surface side (the p-type base layer 6 side) of the silicon carbide semiconductor base, a trench structure is formed. In particular, the trench 16 penetrates the p-type base layer 6 from a surface on a side (first main surface side of the silicon carbide semiconductor base) of the p-type base layer 6, opposite the $n^+$-type silicon carbide substrate 1 side of the p-type base layer 6 and reaches the n-type epitaxial layer 5. Along the inner walls of the trench 16, the bottom and side walls of the trench 16, the gate insulating film 9 is formed, and on the gate insulating film 9 in the trench 16, the gate electrode 10 is formed. The gate electrode 10 is insulated from the n-type drift layer 2 and the p-type base layer 6 by the gate insulating film 9. A portion of the gate electrode 10 may protrude from above (side where a source electrode pad 14 is provided) the trench 16 toward the source electrode pad 14 side.

An interlayer insulating film 11 is provided on the gate electrode 10, and a source electrode 12 is provided.

In the surface on the first side of the n-type drift layer 2 (first main surface side of the silicon carbide semiconductor base), the first $p^+$-type region (first base region of a second conductivity type) 3 and a second $p^+$-type region (second base region of the second conductivity type) 4 are selectively provided. A lower end portion (drain-side end portion) of the first $p^+$-type region 3 is positioned farther on a drain side than the bottom of the trench 16 is. The first $p^+$-type region 3 is constituted by a deep first $p^+$-type base region (deep first base region) 3a at a deep position farther on the drain side (negative direction of z axis) than the bottom of the trench 16 is and a shallow first $p^+$-type base region (shallow first base region) 3b at a position closer to a source side (positive direction of z axis) than the bottom of the trench 16 is. A lower end portion of the second $p^+$-type base region 4 is positioned farther on the drain side than the bottom of the trench 16 is. The second $p^+$-type base region 4 is formed at a position facing the bottom of the trench 16 in a depth direction. A width of the second $p^+$-type base region 4 is wider than a width of the trench 16. The bottom of the trench 16 may reach the second p+-type base region 4, may be positioned in the n-type epitaxial layer 5 between the p-type base layer 6 and the second p+-type base region 4 so as not to contact the second p+-type base region 4.

By providing the deep first p+-type base region 3a and the second pt type region 4 at a position near the bottom of the trench 16 in the depth direction (negative direction of z axis), a pn junction of the deep first p+-type base region 3a and the n-type epitaxial layer 5 and a pn junction of the second p+-type base region 4 and the n-type epitaxial layer 5 may be formed. In this manner, by forming the pn junctions, application of high electric field to the gate insulating film 9 at the bottom of the trench 16 may be prevented. Therefore, even when a wide bandgap semiconductor is used as a semiconductor material, a high breakdown voltage is possible. Further, by providing the second p+-type base region 4 having a width wider than a trench width, the electric field of a corner portion of the bottom of the trench 16 where electric field concentrates may be mitigated, enabling the breakdown voltage to be further increased.

In FIG. 1, although only two trench MOS structures are depicted, more MOS gates (insulated gates including a metal oxide film semiconductor) of a trench structure may be arranged in parallel.

Here, to reduce leak current of the silicon carbide semiconductor device, the inventors simulated leak current variation when lifetimes (defect amounts) of regions of the silicon carbide semiconductor device are varied. FIG. 2 is a graph of resistance and leak current with respect to drain voltage in regions of the silicon carbide semiconductor device according to the embodiment. In FIG. 2, in the n-type drift layer 2, the first p+-type region 3, and the p-type base layer 6, the defect amount for each was set as $2.5 \times 10^{-6}/cm^3$ and $2.5 \times 10^{-10}/cm^3$ and the leak current was simulated.

In FIG. 2, the horizontal axis represents the drain voltage in units of V. The vertical axis represents the leak current in units of μA. Further, a reference curve depicts results of simulation when the defect amount of the n-type drift layer 2, the first p+-type region 3, and the p-type base layer 6 was $2.5 \times 10^{-6}/cm^3$. A curve Pepi depicts results of simulation when the defect amount of the p-type base layer 6 was $2.5 \times 10^{-10}/cm^3$. A curve Drift depicts results of simulation when the defect amount of the n-type drift layer 2 was $2.5 \times 10^{-10}/cm^3$. A curve Deep P depicts results of simulation when the defect amount of the first p+-type region 3 was $2.5 \times 10^{-10}/cm^3$. From these results, it is found that when the defect amount of the first p+-type region 3 is high, leak current increases.

Defects of the first p+-type region 3 have been reported to be formed by ion implantation for forming the first p+-type region 3 (for example, refer to Takeshi Mitani, et al, "Depth Profiling of Ion-Implantation Damage in SiC Crystals by Cathodoluminescence Spectroscopy", (USA), Materials Science Forum, Vols. 600-603 (2009), pp. 615-618). Therefore, when the first p+-type region 3 is formed, a dose amount of the ion implantation is reduced, ions implanted in the first p+-type region 3 are reduced, and the impurity concentration of the first p+-type region 3 is lowered whereby defects of the first p+-type region 3 may be reduced.

However, when the impurity concentration of the first p+-type region 3 is reduced, a function of the first p+-type region 3 may be lost. Functions of the first p+-type region 3, for example, include a first function of increasing the breakdown voltage by mitigating the electric field at the corner portion of the trench 16 and mitigating an application of a high electric field to the gate insulating film 9 at the bottom of the trench 16. Functions of the first p+-type region 3, for example, include a second function of reducing a load on the gate insulating film 9 by efficiently sending to the source electrode 12, hole current generated when avalanche breakdown occurs at a junction portion of the first p+-type region 3 and the n-type drift layer 2.

The first function is a function with respect to the bottom of the trench 16 and therefore, the impurity concentration of portions of the same depth as the bottom of the trench 16 has to be high. Thus, in the silicon carbide semiconductor device of the embodiment, the first p+-type region 3 is double-layered including the deep first p+-type region 3a and the shallow first p+-type region 3b, and the impurity concentration of the shallow first p+-type region 3b is made lower than the impurity concentration of the deep first p+-type region 3a.

The second function may send holes to the source electrode 12 when resistance is low to a certain extent. The resistance of the semiconductor device is rate limited by the resistance of the p-type base layer 6. Therefore, in the silicon carbide semiconductor device of the embodiment, the impurity concentration of the shallow first p+-type region 3b is set to be the impurity concentration the p-type base layer 6 or higher. As a result, hole current may be caused to flow to the source electrode 12 when avalanche breakdown occurs.

Figure 3:
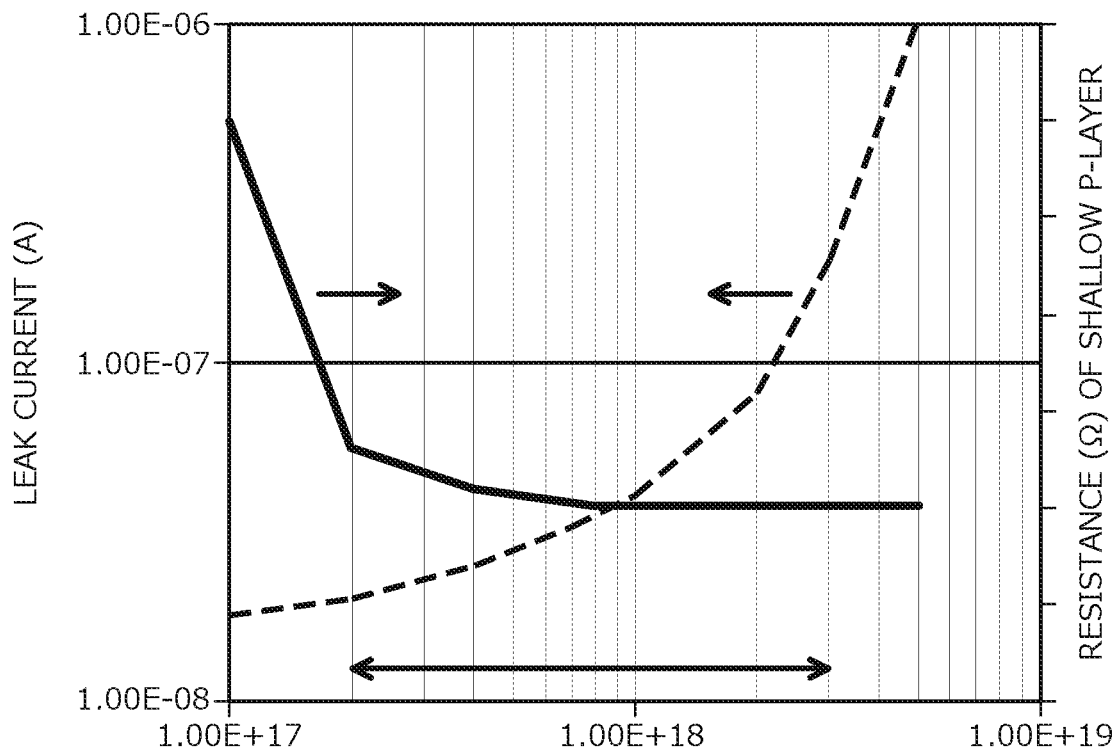
FIG. 3 is a graph of resistance and leak current with respect to impurity concentration of a shallow first $p^+$-type region of the silicon carbide semiconductor device according to the embodiment.

FIG. 3 is a graph of resistance and leak current with respect to the impurity concentration of the shallow first p+-type region 3b of the silicon carbide semiconductor device according to the embodiment. In FIG. 3, the left-vertical axis represents leak current in units of A; the right vertical axis represents resistance values of the first p+-type region 3 in units of Ω. A dotted curve in FIG. 3 represents leak current with respect to the impurity concentration of the shallow first p+-type region 3b. A solid curve in FIG. 3 represents resistance with respect to the impurity concentration of the shallow first p+-type region 3b. As depicted in FIG. 3, when the impurity concentration of the shallow first p+-type region 3b is low, defects of the first p+-type region 3 decrease and the leak current of the semiconductor device decreases, however, the resistance of the semiconductor device increases.

Therefore, when the leak current is set to be a certain value or less, for example, $1 \times 10^{-7}$ A or less, to set the resistance value of the shallow first p+-type region 3b to a certain value or less, the impurity concentration of the shallow first p+-type region 3b may be preferably set to be $2.0 \times 10^{17}$ to $4.5 \times 10^{18}/cm^3$. In this case, for example, a film thickness of the p-type base layer 6 is set to 1.3 μm and the impurity concentration of the p-type base layer 6 is set to $2.0 \times 10^{17}/cm^3$. Further, for example, the film thickness of the deep first p+-type region 3a is set to 0.5 μm and the impurity concentration of the deep first p+-type region 3a is set to $5.0 \times 10^{18}/cm^3$. Further, the film thickness of the shallow first p+-type region 3b is set to 0.5 μm.

Further, in FIG. 1, although widths of the deep first p+-type region 3a and the shallow first p+-type region 3b are the same, the width of the shallow first p+-type region 3b may be wider than the width of the deep first p+-type region 3a. In this case, the resistance of the shallow first p+-type region 3b decreases, enabling the impurity concentration of the shallow first p+-type region 3b to be further reduced.

Figure 4:
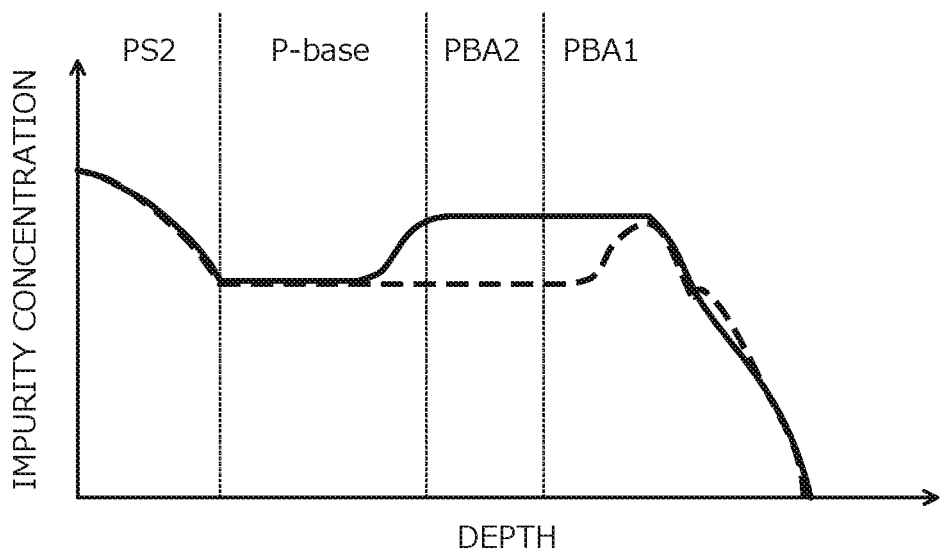
FIG. 4 is a graph of impurity concentration with respect to depth in the silicon carbide semiconductor device according to the embodiment.

FIG. 4 is a graph of impurity concentration with respect to depth in the silicon carbide semiconductor device according to the embodiment. In FIG. 4, the vertical axis represents the impurity concentration and horizontal axis represents depth. A dotted curve represents the impurity concentration with respect to depth in the silicon carbide semiconductor device according to the embodiment. For comparison, a solid curve represents the impurity concentration with respect to depth in a conventional silicon carbide semiconductor device. Further, PS2 represents the p++-type contact region 8; P-base represents the p-type base layer 6; PBA2 represents the shallow first p+-type region 3b; and PBA1 represents the deep first p+-type region 3a. As depicted in FIG. 4, the impurity concentration decreases as the depth increases. In the silicon carbide semiconductor device according to the embodiment, at PBA2, the impurity concentration is lower than that of the silicon carbide semiconductor device.

A method of manufacturing a semiconductor device according to the embodiment will be described. FIGS. 5, 6, 7, 8, 9, and 10 are cross-sectional views of the silicon carbide semiconductor device according to the embodiment during manufacture.

Figure 5:
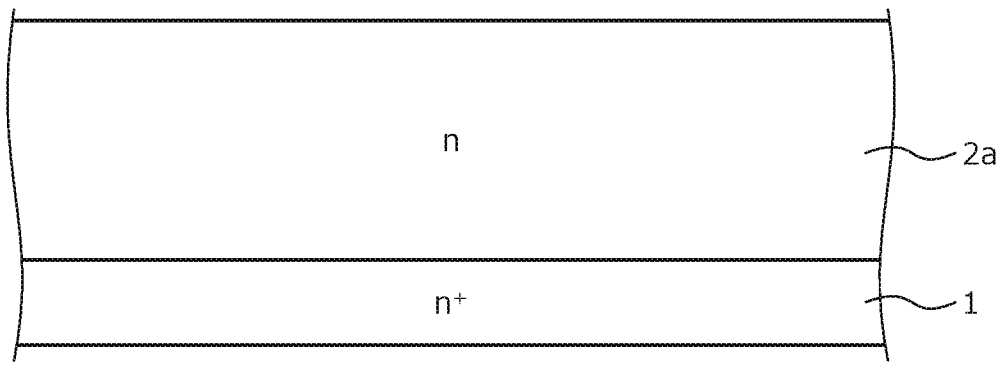
FIGS. 5, 6, 7, 8, 9, and 10 are cross-sectional views of the silicon carbide semiconductor device according to the embodiment during manufacture.

First, the n+-type silicon carbide substrate 1 including an n-type silicon carbide is prepared. On the first main surface of the n+-type silicon carbide substrate 1, a first n-type drift layer (first wide bandgap semiconductor layer of the first conductivity type) 2a is formed by epitaxial growth using silicon carbide to have a thickness of, for example, about 30 μm while an n-type impurity, for example, nitrogen atoms (N) is doped. The first n-type drift layer 2a becomes the n-type drift layer 2. The state up to here is depicted in FIG. 5.

Figure 6:
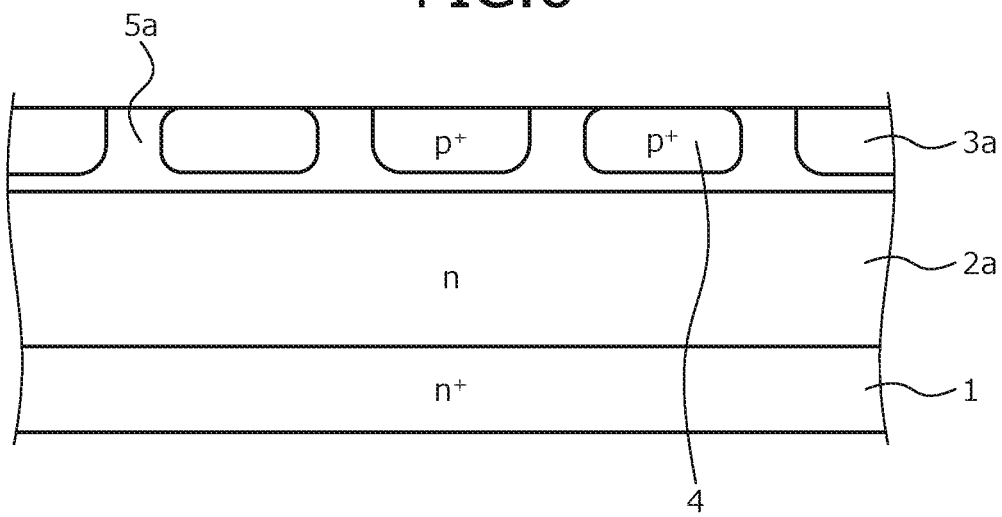

Next, on a surface of the first n-type drift layer 2a, a non-depicted mask having a desired opening is formed by photolithography using, for example, an oxide film. A p-type impurity, for example, aluminum atoms (Al), is ion implanted using the oxide film as a mask. By this process, at a portion of a surface region of the first n-type drift layer 2a, the deep first p+-type region (first base region of the second conductivity type) 3a having a depth of, for example, about 0.5 μm and the second p+-type region (second base region of the second conductivity type) 4 are formed so that, for example, a distance between the deep first p+-type region 3a and an adjacent second p+-type base region 4 is about 1.0 μm. A dose amount at the time of ion implantation for forming the deep first p+-type region 3a and the second p+-type base region 4, for example, may be set so that the impurity concentration becomes about $5 \times 10^{18}/cm^3$. Next, the mask used at the time of ion implantation for forming the deep first p+-type region 3a and the second p+-type base region 4 is removed. An n-type impurity, for example, nitrogen atoms, is ion implanted. As a result, a first n-type epitaxial layer 5a of a surface layer of the first n-type drift layer 2a is formed to a depth of, for example, about 0.5 μm or less between the deep first p+-type region 3a and the second p+-type base region 4. A dose amount at the time of ion implantation for forming the first n-type epitaxial layer 5a, for example, may be set so that the impurity concentration becomes $1 \times 10^{17}/cm^3$. The state up to here is depicted in FIG. 6.

Next, on the surface of the first n-type drift layer 2a, a second n-type drift layer (second wide bandgap semiconductor layer of the first conductivity type) 2b is formed by epitaxial growth to have a thickness of, for example, about 0.5 μm while an n-type impurity, for example, nitrogen atoms, is doped. The second n-type drift layer 2b and the first n-type drift layer 2a together constitute the n-type drift layer 2. Conditions of the epitaxial growth for forming the second n-type drift layer 2b, for example, may be set so that the impurity concentration of the second n-type drift layer 2b becomes about $3 \times 10^{15}/cm^3$.

Figure 7:
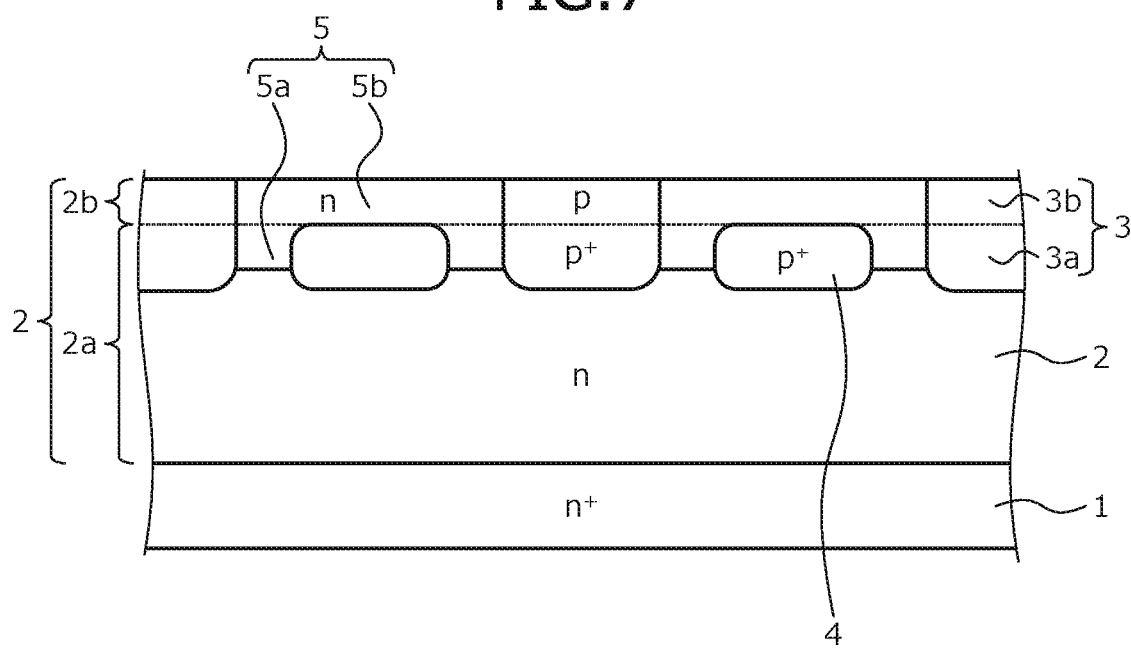

Next, on the surface of the n-type drift layer 2, a non-depicted mask having a desired opening is formed by photolithography using, for example, an oxide film. A p-type impurity, for example, aluminum atoms (Al), is ion implanted using the oxide film as a mask. By this process, at a portion of a surface region of the first n-type drift layer 2a, the shallow first p+-type region (first base region of the second conductivity type) 3b is formed, for example, to a depth of about 0.5 μm, for example, so as to overlap an upper portion of the deep first p+-type region 3a. The shallow first p+-type region 3b and the deep first p+-type region 3a together constitute the first p+-type region 3. A dose amount at the time of ion implantation for forming the shallow first p+-type region 3b, for example, may be set so that the impurity concentration becomes about $2 \times 10^{17}$ to $4.5 \times 10^{18}/cm^3$. Next, the mask used at the time of ion implantation for forming the shallow first p+-type region 3b is removed. An n-type impurity, for example, nitrogen atoms, is ion implanted. As a result, at a portion of a surface layer of the second n-type drift layer 2b, the second n-type epitaxial layer (second region of the first conductivity type) 5b is formed to a depth of, for example, about 0.5 μm so as to be in contact with the deep first p+-type region 3a, the second p+-type base region 4, and the first n-type epitaxial layer 5a. A dose amount at the time of ion implantation for forming the second n-type epitaxial layer 5b, for example, may be set so that that the impurity concentration becomes about $1 \times 10^{17}/cm^3$. The second n-type epitaxial layer 5b and the first n-type epitaxial layer 5a together constitute the n-type epitaxial layer 5. The state up to here is depicted in FIG. 7.

Next, on the surface (i.e., surfaces of the first p+-type region 3 and the second n-type epitaxial layer 5b) of the n-type drift layer 2, the p-type base layer (second-conductivity-type wide bandgap semiconductor layer) 6 is formed by epitaxial growth to have a thickness of, for example, about 0.9 to 1.3 μm while a p-type impurity, for example, aluminum atoms, is doped. Conditions of the epitaxial growth for forming the p-type base layer 6 may be set so that, for example, the impurity concentration becomes about $2 \times 10^{17}/cm^3$, which is less than or equal to the impurity concentration of the first p+-type region 3. By the processes up to here, the silicon carbide semiconductor base in which the n-type drift layer 2 and the p-type base layer 6 are stacked on the n+-type silicon carbide substrate 1 is formed.

Figure 8:
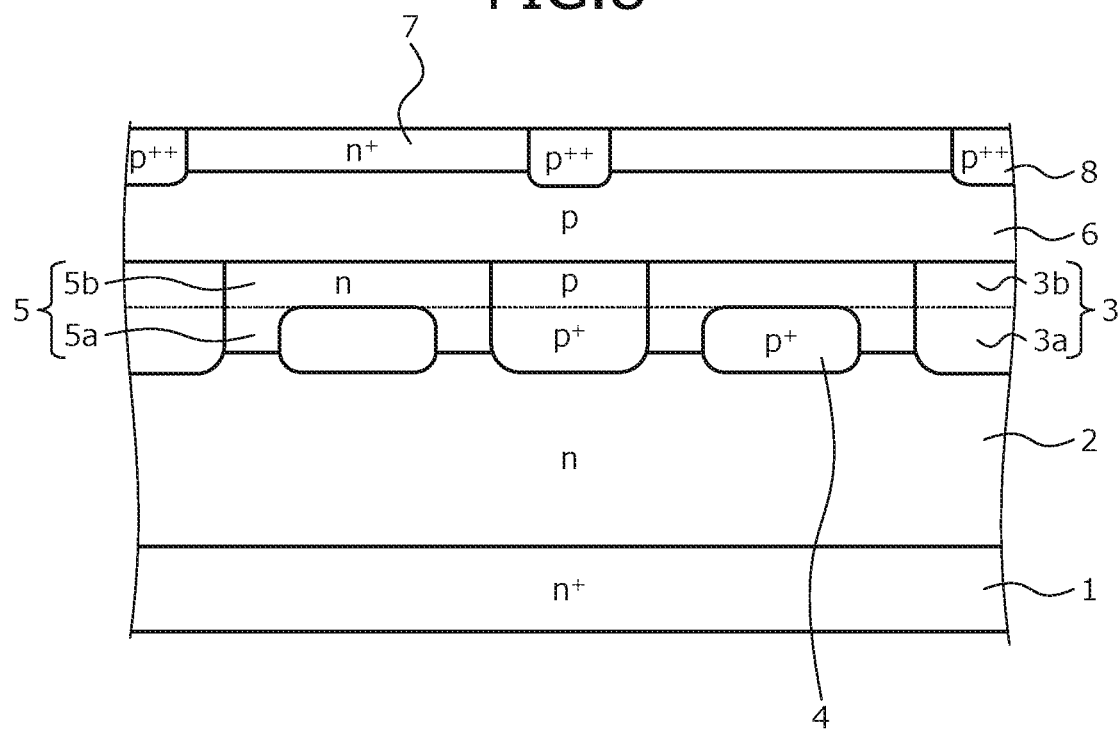

Next, on a surface of the p-type base layer 6, a non-depicted mask having a desired opening is formed by photolithography using, for example, an oxide film. An n-type impurity, for example, phosphorus (P), is ion implanted using the oxide film as a mask. By this process, at a portion of a surface layer of the p-type base layer 6, the n+-type source region (source region of the first conductivity type) 7 is formed. A dose amount at the time of ion implantation for forming the n+-type source region 7, for example, may be set so that the impurity concentration becomes higher than that of the first p+-type region 3. Next, the mask used at the time of ion implantation for forming the n+-type source region 7 is removed. On the surface of the p-type base layer 6, a non-depicted mask having a desired opening is formed by photolithography using, for example, an oxide film and a p-type impurity, for example, aluminum ions, is ion implanted using the oxide film as a mask. By this process, at a portion of the surface layer of the p-type base layer 6, the p++-type contact region 8 is formed. A dose amount at the time of ion implantation for forming the p++-type contact region 8, for example, may be set so that the impurity concentration becomes higher than that of the second p+-type region 4. Subsequently, the mask used at the time of ion implantation for forming the p'-type contact region 8 is removed. The sequence of the ion implantation for forming the n$^+$-type source region 7 and the ion implantation for forming the p$^{++}$-type contact region 8 may be interchanged. The state up to here is depicted in FIG. 8.

Next, heat treatment (annealing) is performed, activating, for example, the deep first p$^+$-type region 3a, the shallow first p$^+$-type region 3b, the n$^+$-type source region 7, and the p$^{++}$-type contact region 8. A temperature of the heat treatment, for example, may be about 1700 degrees C. The duration of the heat treatment, for example, may be about 2 minutes. As described, ion implanted regions may be collectively activated by one session of heat treatment or heat treatment and activation may be performed with each ion implantation.

Figure 9:
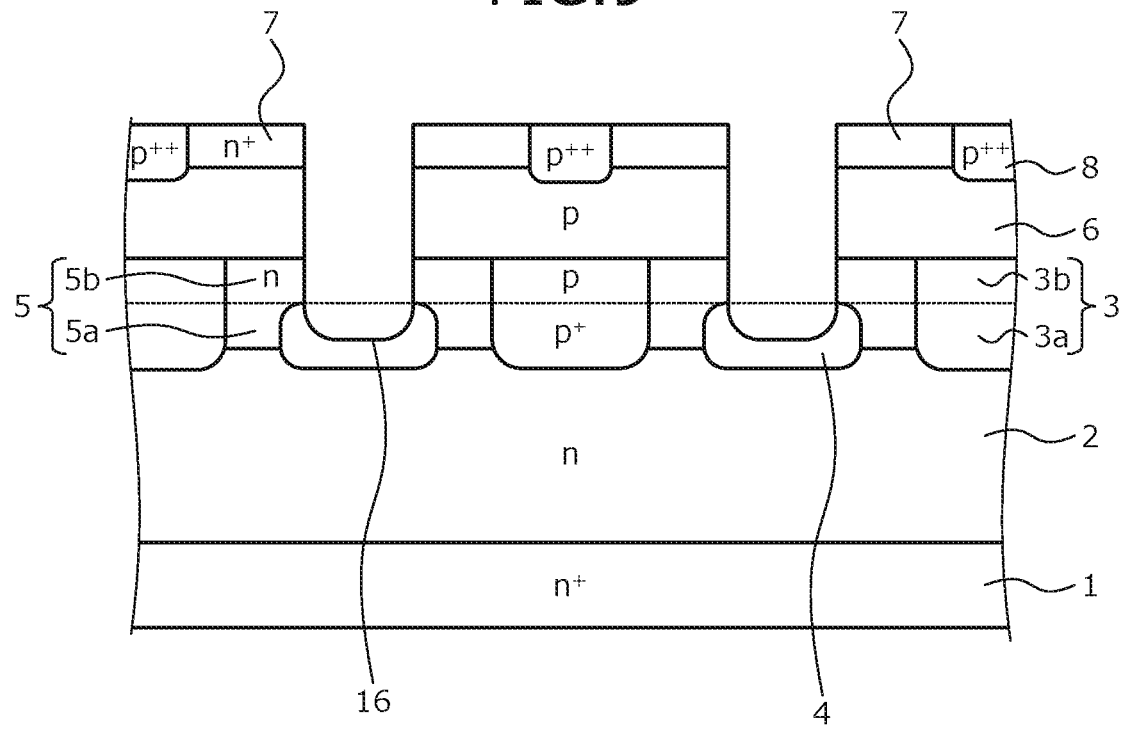

Next, on the surface of the p-type base layer 6 (i.e., surfaces of the n$^+$-type source region 7 and the p''-type contact region 8), a non-depicted mask having a desired opening is formed by photolithography using, for example, an oxide film. The trench 16 is formed by, for example, dry etching using the oxide film as a mask so that the trench 16 penetrates the n$^+$-type source region 7 and the p-type base layer 6, and reaches the n-type epitaxial layer 5. The bottom of the trench 16 may reach the second p$^+$-type region 4 and may be positioned in the n-type epitaxial layer 5, between the p-type base layer 6 and the second p$^+$-type region 4. Subsequently, the mask used for forming the trench 16 is removed. The state up to here is depicted in FIG. 9.

Next, the gate insulating film 9 is formed along the surface of the n$^+$-type source region 7, the surface of the p$^{++}$-type contact region 8, and the bottom and side walls of the trench 16. The gate insulating film 9 may be formed by thermal oxidation by heat treatment at a temperature of about 1000 degrees C. in an oxygen atmosphere. Further, the gate insulating film 9 may be formed by a deposition method by a chemical reaction such as high temperature oxide (HTO) deposition.

Next, on the gate insulating film 9, for example, a polycrystalline silicon layer doped with phosphorus atoms is formed. The polycrystalline silicon layer is formed so as to be embedded in the trench 16. The polycrystalline silicon layer is patterned and left in the trench 16, forming the gate electrode 10. A portion of the gate electrode 10 may protrude from above (source electrode pad 14 side) the trench 16 toward the source electrode pad 14 side.

Figure 10:
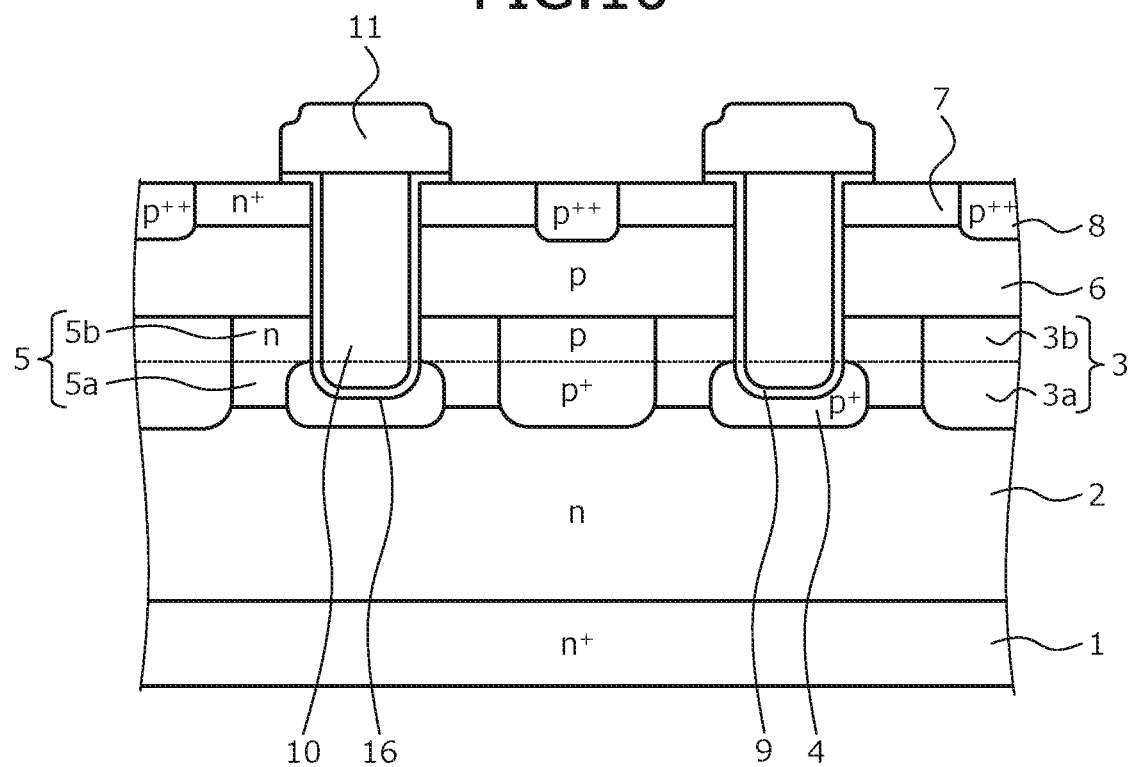

Next, for example, phosphate glass is formed to have a thickness of about 1 μm so as to cover the gate insulating film 9 and the gate electrode 10, forming the interlayer insulating film 11. The interlayer insulating film 11 and the gate insulating film 9 are patterned and selectively removed to form a contact hole contact hole and expose the n$^+$-type source region 7 and the p''-type contact region 8. Thereafter, heat treatment (reflow) is performed and the interlayer insulating film 11 is planarized. The state up to here is depicted in FIG. 10.

Subsequently, in the contact hole and on the interlayer insulating film 11, a conductive film to become the source electrode 12 is formed. The conductive film is selectively removed, for example, leaving the source electrode 12 only in the contact hole.

Next, on the second main surface of the n$^+$-type silicon carbide substrate 1, the drain electrode 13 is formed using, for example, a nickel (Ni) film. Thereafter, for example, heat treatment at a temperature of about 970 degrees C. is performed, forming an ohmic junction of the n$^+$-type silicon carbide substrate 1 and the drain electrode 13.

Next, for example, an aluminum film is formed by a sputtering method to have a thickness of, for example, about 5 μm and to cover the source electrode 12 and the interlayer insulating film 11. Thereafter, the aluminum film is selective removed so as to leave a portion covering the active region of the element overall, thereby forming the source electrode pad 14.

Next, on a surface of the drain electrode 13, for example, titanium (Ti), nickel, and gold (Au) are sequentially stacked whereby the drain electrode pad 15 is formed. Thus, the semiconductor device depicted in FIG. 1 is completed.

As described above, according to the silicon carbide semiconductor device of the embodiment, the first p$^+$-type region is double-layered, including the deep first p$^+$-type region and the shallow first p$^+$-type region, where the impurity concentration of the shallow first p$^+$-type region is lower than the impurity concentration of the deep first p$^+$-type region. As a result, ion implantation to the shallow first p$^+$-type region is reduced, enabling defects at the shallow first p$^+$-type region to be reduced. Therefore, the silicon carbide semiconductor device according to the embodiment may suppress high-voltage current leakage.

Further, according to the silicon carbide semiconductor device of the embodiment, the impurity concentration of the deep first p$^+$-type region is an impurity concentration that is higher than the impurity concentration of the shallow first p$^+$-type region whereby the breakdown voltage may be increased by mitigating the electric field of the corner portion of the trench and application of high electric field to the gate insulating film at the bottom of the trench may be mitigated. Further, according to the silicon carbide semiconductor device of the embodiment, since the impurity concentration of the shallow first p$^+$-type region is equal to or greater than the impurity concentration of the p-type base layer, hole current may flow to the source electrode when avalanche breakdown occurs.

Further, the impurity concentration of the shallow first p$^+$-type region is set to be $2.0 \times 10^{17}$ to $4.5 \times 10^{18}/\text{cm}^3$ whereby leak current is set to be a certain value or less, for example, $1 \times 10^{-7}$ A, enabling the resistance value of the shallow first p$^+$-type region to be set to a certain value or less.

Further, the width of the shallow first p$^+$-type region is wider than that of the deep first p$^+$-type region, enabling the resistance of the shallow first p$^+$-type region to be reduced. Therefore, the impurity concentration of the shallow first p$^+$-type region may be further reduced.

Although description has been given taking an example in which the first main surface of a silicon carbide substrate including silicon carbide is a (0001) face and on the (0001) face, a MOS gate structure is formed, the present invention is not limited hereto and various modifications are possible such as the type of wide bandgap semiconductor (for example, gallium nitride (GaN), etc.), plane orientation of the main surface, etc. Further, in the embodiments, although the first conductivity type is set as an n-type and the second conductivity type is set as a p-type, the present invention is similarly implemented when the first conductivity type is set as a p-type and the second conductivity type is set as an n-type.

Figure 11:
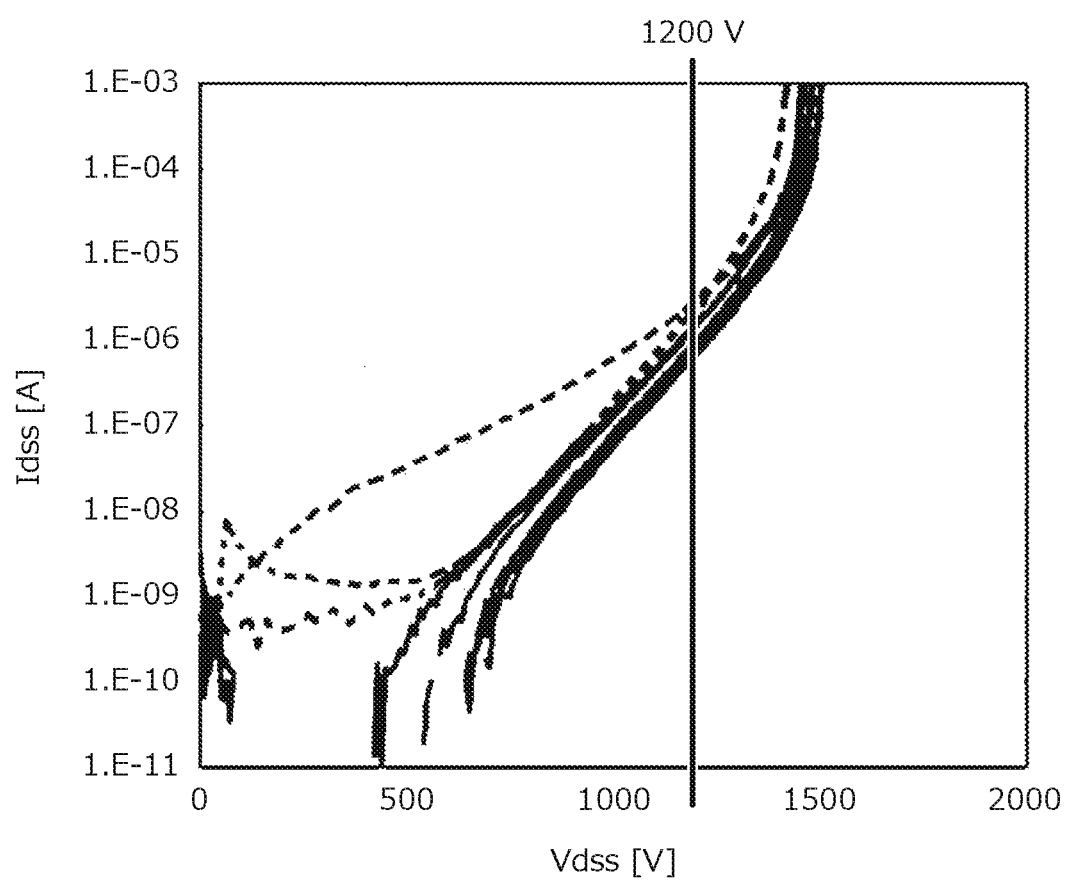
FIG. 11 is a graph of high-voltage current leakage in a conventional trench-type silicon carbide semiconductor device.

However, in a conventional trench-type silicon carbide semiconductor device, leak current between the drain and source, which increases dependent on voltage, causes a large leak current to occur in high-voltage areas. FIG. 11 is a graph of high-voltage current leakage in a conventional trench-type silicon carbide semiconductor device. In FIG. 11, the vertical axis represents drain saturation current in units of A. The horizontal axis represents voltage between the drain and source in units of V. As depicted in FIG. 11, in the conventional semiconductor device, at high voltages, leak current of about 1 pA occurs.

As described, the first base region of the second conductivity type is double-layered, including the deep first base region and the shallow first base region, where the impurity concentration of the shallow first base region is made lower than the impurity concentration of the deep first base region. As a result, ions implanted to the shallow first base region are reduced, enabling defects in the shallow first base region to be reduced. Therefore, in the silicon carbide semiconductor device according to the present invention, high-voltage current leakage is suppressed.

Further, according to the semiconductor device of the present invention, the impurity concentration of the deep first base region is higher than the impurity concentration of the shallow first base region whereby the breakdown voltage may be increased by mitigating the electric field at the corner portion of the trench and application of high electric field to the gate insulating film at the bottom of the trench may be mitigated. Further, according to the semiconductor device of the embodiment, the impurity concentration of the shallow first base region is equal to or higher than the impurity concentration of the second-conductivity-type wide bandgap semiconductor layer, enabling hole current to flow to the source electrode when avalanche breakdown occurs.

The semiconductor device and the method of manufacturing a semiconductor device according to the present invention have an effect in that high-voltage current leakage may be suppressed.

As described, the semiconductor device and the method of manufacturing a semiconductor device according to the present invention are useful for high-voltage semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a wide bandgap semiconductor substrate of a first conductivity type including a semiconductor having a bandgap wider than that of silicon;
   a first-conductivity-type wide bandgap semiconductor layer provided on a front surface of the wide bandgap semiconductor substrate and including a semiconductor having a bandgap wider than that of silicon, the first-conductivity-type wide bandgap semiconductor layer having an impurity concentration that is lower than that of the wide bandgap semiconductor substrate, the first-conductivity-type wide bandgap semiconductor layer having a first side and a second side that is opposite the first side, the second side facing the wide-bandgap semiconductor substrate, and the first-conductivity-type wide bandgap semiconductor layer including a surface layer at the first side;
   a first base region of a second conductivity type selectively provided in the surface layer of the first-conductivity-type wide bandgap semiconductor layer;
   a second base region of the second conductivity type selectively provided in the first-conductivity-type wide bandgap semiconductor layer;
   a second-conductivity-type wide bandgap semiconductor layer provided on a surface at the first side of the first-conductivity-type wide bandgap semiconductor layer, the second-conductivity-type wide bandgap semiconductor layer including a semiconductor having a bandgap wider than silicon;
   a source region of the first conductivity type selectively provided in the second-conductivity-type wide bandgap semiconductor layer;
   a trench penetrating the source region and the second-conductivity-type wide bandgap semiconductor layer, and reaching the first-conductivity-type wide bandgap semiconductor layer;
   a gate electrode provided in the trench on a gate insulating film;
   a source electrode in contact with the second-conductivity-type wide bandgap semiconductor layer and the source region; and
   a drain electrode provided on a rear surface of the wide bandgap semiconductor substrate, wherein
   the first base region has a deep first base region and a shallow first base region, the deep first base region being at a position farther toward the drain electrode than is a bottom of the trench and a bottom of the shallow first base region being at a position closer to the source region than is the bottom of the trench, the deep first base region and the shallow first base region being spaced from the trench by the first-conductivity-type wide bandgap semiconductor layer intervening therebetween,
   an impurity concentration of the shallow first base region is lower than an impurity concentration of the deep first base region, and
   the deep first base region and the shallow first base region are entirely spaced from the trench in a depth direction of the trench by the first-conductivity-type wide bandgap semiconductor layer.

2. The semiconductor device according to claim 1, wherein
   the impurity concentration of the shallow first base region is at least an impurity concentration of the second-conductivity-type wide bandgap semiconductor layer.

3. The semiconductor device according to claim 2, wherein
   the impurity concentration of the shallow first base region is $2 \times 10^{17}/cm^3$ to $4.5 \times 10^{18}/cm^3$.

4. The semiconductor device according to claim 1, wherein
   a width of the shallow first base region is wider than a width of the deep first base region.

5. The semiconductor device according to claim 1, wherein the first-conductivity-type wide bandgap semiconductor layer includes a drift layer portion and an epitaxial layer formed on the drift layer portion, and
   the trench extends into the epitaxial layer without penetrating through the epitaxial layer.

6. The semiconductor device according to claim 5, wherein the second base region of the second conductivity type extends from a base of the trench in the epitaxial layer into the drift layer portion in a depth direction.

7. The semiconductor device according to claim 1, wherein the first-conductivity-type wide bandgap semiconductor layer includes a drift layer portion and an epitaxial layer formed on the drift layer portion, and
   the deep first base region extends from inside the epitaxial layer into the drift layer portion in a depth direction.

8. The semiconductor device according to claim 1, wherein the deep first base region and the second base region of the second conductivity type extend to a same depth in the first-conductivity-type wide bandgap semiconductor layer.

9. The semiconductor device according to claim 1, wherein the first base region and the second base region are separated by the first-conductivity-type wide bandgap semiconductor layer in a lateral direction.

10. The semiconductor device of claim 1, wherein the first-conductivity-type wide bandgap semiconductor layer includes a drift layer portion, a first epitaxial layer formed on the drift layer portion, and a second epitaxial layer formed on the first epitaxial layer,
  wherein the deep first base region is formed in the first epitaxial layer, and the shallow first base region is formed in the second epitaxial layer.

11. The semiconductor device of claim 10, wherein the second base region is formed in the first epitaxial layer.

12. The semiconductor device according to claim 1, wherein the shallow first base region is in direct contact with the second-conductivity-type wide bandgap semiconductor layer.

13. The semiconductor device according to claim 1, wherein the bottom of the trench is located inside the second base region and a width of the second base region is wider than a width of the trench for mitigating an electric field to be formed at the bottom and a corner of the trench where the electric field concentrates.

14. The semiconductor device according to claim 1, wherein the impurity concentration of the shallow first base region is equal to or more than $2\times10^{17}/cm^3$ and less than $1\times10^{18}/cm^3$.

* * * * *